US009349591B2

(12) United States Patent
Cheng et al.

(10) Patent No.: US 9,349,591 B2
(45) Date of Patent: May 24, 2016

(54) CRYSTAL FORMATION ON NON-LATTICE MATCHED SUBSTRATES

(71) Applicant: International Business Machines Corporation, Armonk, NY (US)

(72) Inventors: Cheng-Wei Cheng, White Plains, NY (US); Guy M. Cohen, Mohegan Lake, NY (US); Devendra K. Sadana, Pleasantville, NY (US); Brent A. Wacaser, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/525,594

(22) Filed: Oct. 28, 2014

(65) Prior Publication Data

US 2016/0118248 A1 Apr. 28, 2016

(51) Int. Cl.
*H01L 21/02* (2006.01)
*H01L 29/267* (2006.01)

(52) U.S. Cl.
CPC ...... *H01L 21/02488* (2013.01); *H01L 21/0254* (2013.01); *H01L 21/02373* (2013.01); *H01L 21/02496* (2013.01); *H01L 21/02543* (2013.01); *H01L 21/02546* (2013.01); *H01L 21/02549* (2013.01); *H01L 21/02664* (2013.01); *H01L 29/267* (2013.01)

(58) Field of Classification Search
CPC ............ H01L 21/02488; H01L 29/267; H01L 21/02373; H01L 21/02496; H01L 21/02549; H01L 21/0254; H01L 21/02546; H01L 21/02543; H01L 21/02664
See application file for complete search history.

(56) References Cited

U.S. PATENT DOCUMENTS

| 3,767,473 | A | * | 10/1973 | Ayel et al. ...................... 438/971 |
| 4,093,704 | A | | 6/1978 | Jacob |
| 5,356,509 | A | | 10/1994 | Terranova et al. |
| 5,397,736 | A | | 3/1995 | Bauser et al. |
| 6,106,613 | A | | 8/2000 | Sato et al. |
| 7,528,002 | B2 | | 5/2009 | Samuelson et al. |
| 8,299,502 | B2 | | 10/2012 | Lourdudoss et al. |

(Continued)

OTHER PUBLICATIONS

Kapadia et al., "A direct thin-film path towards low-cost large-area III-V photovoltaics", Scientific Reports, 3:2275, 2013, (Received Apr. 19, 2013, Published Jul. 24, 2013).

(Continued)

*Primary Examiner* — Michelle Mandala
(74) *Attorney, Agent, or Firm* — Mark G. Edwards; Louis Percello

(57) ABSTRACT

A semiconductor structure can be created by forming an insulator layer over a surface of a substrate. An intermediate layer can be formed on top of the insulator layer, wherein openings in the intermediate layer may expose regions of the insulator. Openings may be formed in the exposed regions of the insulator layer to create exposed areas of the substrate. A first element of a multi-element semiconductor can be deposited onto the exposed regions of the insulator layer, into the openings in the exposed regions of the insulator layer, and onto the exposed areas of the substrate. A capping layer can be formed over the first element of the multi-element semiconductor. The first element can be melted. A liquid solution can be created by dissolving a second element of the multi-element semiconductor into first element. A multi-element semiconductor, seeded off the substrate, can be formed from the liquid solution.

19 Claims, 8 Drawing Sheets

(56) References Cited

U.S. PATENT DOCUMENTS

2011/0049568 A1* 3/2011 Lochtefeld ........ H01L 21/02381 257/190
2015/0001588 A1* 1/2015 Gunji et al. ................... 438/492

OTHER PUBLICATIONS

Tojo et al., "High-quality formation of multiply stacked SiGe-on-insulator structures by temperature-modulated successive rapid-melting-growth", Applied Physics Letters, pp. 1-4, 102(9): 092102, 2013, (Published Mar. 4, 2013), © 2013 American Institute of Physics.

Wacaser et al., "Size-selected compound semiconductor quantum dots by nanoparticle conversion", Nanotechnology pp. 1-8, 18 (2007) 105306, (Published Feb 6, 2007), © 2007 IOP Publishing Ltd.

Wagner et al., "Vapor-Liquid-Solid Mechanism of Single Crystal Growth", Applied Physics Letters, pp. 89-90, vol. 4, No. 5, Mar. 1, 1964.

* cited by examiner

CRYSTAL FORMATION ON NON-LATTICE MATCHED SUBSTRATES

BACKGROUND

The present disclosure relates to crystal growth on semiconductor substrates, and more specifically, to epitaxial growth of group III-V crystals on group IV substrates.

Semiconductor structures can include a semiconductor substrate upon which alternating layers of conductive and insulative material are deposited to form electronic devices. The semiconductor substrate may be composed of semiconductor material grown from a single element, or from multi-element molecules. The semiconductor's constituent elements dictate the thermal, electrical, and optical properties of the devices constructed from these materials. Some semiconductor structures may include additional layers of semiconductor material, separated from the substrate by intervening conductive or insulative layers. These structures allow for the construction of devices that may benefit, concurrently, from the properties of disparate semiconductor materials.

SUMMARY

According to embodiments of the present disclosure, a method can be used to make a semiconductor structure, having a single crystal multi-element semiconductor with a first lattice constant, on a crystalline semiconductor substrate having a second lattice constant different from the multi-element semiconductor, with a crystallographic orientation of both semiconductors being related. The method includes forming an insulator layer over a surface of the semiconductor substrate. An intermediate layer can be formed on top of the insulator layer. One or more openings can be formed in the intermediate layer to create exposed regions of the insulator layer. Openings can be formed in the exposed regions of the insulator layer to create exposed areas of the semiconductor substrate. A first element of the multi-element semiconductor can be deposited onto the exposed regions of the insulator layer, and onto the exposed areas of the substrate. A capping layer can be formed, wherein the capping layer extends over the first element of the multi-element semiconductor. The first element of the multi-element semiconductor can be melted. A liquid solution can be created by dissolving a second element of the multi-element semiconductor into first element of the multi-element semiconductor. A single crystal multi-element semiconductor, seeded off the semiconductor substrate, can be formed from the liquid solution.

Various embodiments are directed toward a semiconductor structure that includes a semiconductor substrate; an insulator layer extending over the surface of the substrate, with one or more openings exposing areas of the substrate; an intermediate layer that exposes areas of the insulator layer and the openings in the insulator layer; a single crystal multi-element semiconductor having a second lattice constant different from the first lattice constant, seeded from the substrate, and extending over the exposed regions of the insulator layer and the openings of the insulator layer; a capping layer extending over the single crystal multi-element semiconductor and over adjacent areas of the intermediate layer, and creating a cavity containing the single crystal multi-element semiconductor.

Various embodiments are directed toward a semiconductor structure that includes a substrate that is a crystalline semiconductor having a first lattice constant; an insulator layer extending over a region of the substrate; a single crystal multi-element semiconductor having a second lattice constant that is different from the first lattice constant, seeded from a point on the substrate, and extending up and over a region of the insulator layer.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
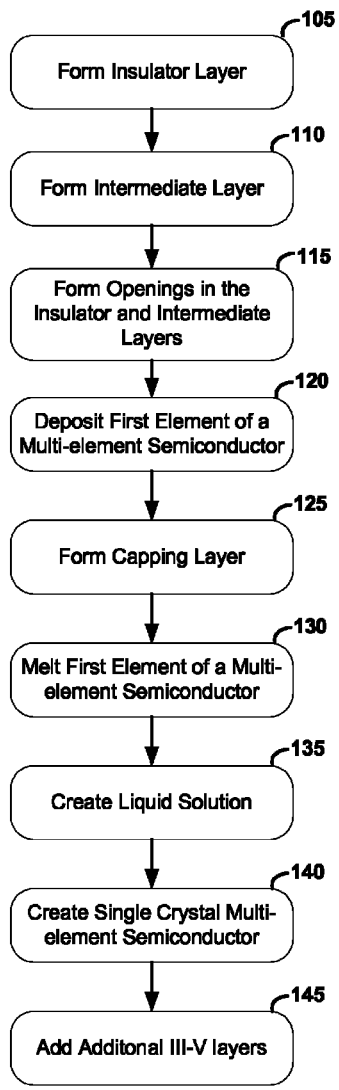
FIG. 1 depicts steps of a method for creating a semiconductor structure, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to crystal growth on semiconductor substrates, more particular aspects relate to epitaxial growth of group III-V crystals on group IV substrates. While the present disclosure is not necessarily limited to such applications, various aspects of the disclosure may be appreciated through a discussion of various examples using this context.

Group IV semiconductors, and in particular silicon, can be a common choice for building electronic circuits. Large silicon substrates can be cheap to make, and easier to process than semiconductor materials from other groups in the periodic table. Semiconductor materials made of elements from other groups, however, can have characteristics that may make them more desirable in certain applications than group IV semiconductors. Particularly, group III-V materials can have higher electron mobility, exhibit direct band gaps and tunable band gaps with ternary and even quaternary compounds. Higher electron mobility allows for devices to be built with enhanced current conducting capabilities using electrons as charge carriers, resulting in improved switching speeds, and more efficient energy usage. Semiconductors having direct band gaps allow for the construction of optoelectronic devices including lasers, light modulators, light emitting diodes, and efficient photoreceptive devices, such as solar cells and optical sensors. Semiconductors having tunable band gaps allow devices to be built to suit diverse applications, including low voltage switching, or photoemission and sensing across disparate wavelengths of light. A manufacturing process which integrates group III-V semiconductors with group IV substrates by, for example, growing group III-V crystals on group IV substrates, could produce devices that take advantage of group III-V's electrical and optical characteristics while still retaining the industrial and processing benefits of group IV materials.

Embodiments of the present disclosure are based on the recognition that growing group III-V materials on large areas of a group IV substrates can be difficult due to, inter alia, differences in the crystallographic structure of the two materials. First, it may be desirable for the group III-V material to be epitaxial to—e.g., to mimic the same crystallographic structure as—the underlying group IV substrate. A mismatch between the two materials can lead to dislocation defects, adversely affecting the electrical and optical properties of the composite structure. Another difficulty with integrating the two materials into one device can be the differences in the coefficient of heat expansion between the two materials. The difference in the coefficient of heat expansion may lead to threading dislocation defects across large areas of the film. Finally, integration can be complicated by the fact that elements from group III and V of the periodic table are dopants for group IV semiconductors, and the elements of group IV are dopants for group III-V semiconductors. Since registry between the group III-V semiconductor crystal and the group IV substrate can be an artifact of epitaxial growth of the group III-V material on the group IV substrate, devices constructed from the integrated materials may be affected by mutual doping at the interface of the two materials.

Embodiments of the present disclosure are directed toward a method for forming small islands of single crystal multi-element semiconductors on top of a crystalline semiconductor substrate, with the crystal orientation of the crystalline islands registered to the orientation of the substrate. The single crystal multi-element semiconductor may be predominantly made from a group III-V semiconductor (e.g. GaAs, InP, AN, InSb, InGaAs, and InGaAsP), and the crystalline substrate may be predominantly made from group IV elements, such as silicon. Growing small islands of crystals, rather than large regions, may facilitate epitaxial growth while reducing stress related defects. Each island, for example, may be individually seeded off the substrate, thus increasing the chance of nucleation starting from the desired nucleation sites, and promoting the molecular interactions need to form the crystals. Additionally, restricting crystal growth to small islands may reduce stress caused by thermal expansion (by reducing the dimensions of the crystals), and may prevent threading defects originating on one island from propagating to other structures.

In some embodiments, the method may include growing islands of the multi-element crystals on top of regions of an insulator layer, where the insulator layer is deposited (or grown) on top of a crystalline substrate. The insulator layer may be a glass, such as silicon oxide. The regions of the insulator layer may have one or more openings exposing the underlying substrate. The insulator layer provides a barrier that can reduce the effects of mutual doping between the multi-element crystal and the substrate. Openings in the insulator layer can encourage epitaxial growth by allowing the multi-element crystals to be seeded off the substrate; crystals seeded in this manor may develop the same crystallographic orientation as the substrate source.

Various embodiments may also include depositing a first element of the multi-element crystal onto the insulator in certain locations, shapes, and amounts. The first element of the multi-element crystal may be predominantly made from one or more group III metals, such as gallium, indium, antimony and aluminum. The first element may be deposited across desired regions of the insulator layer, into openings in the insulator layer, and onto the exposed areas of the underlying substrate. The deposits of the first element may determine the shapes and locations of the islands of the multi-element crystals. This in turn may define the location and dimensions of the active areas of devices built from the crystals. The active area of gallium-arsenide (GaAs) transistors in an electrical circuit, for example, could be defined by patterning a mask with features defining the shape and location of the transistors, and then using the mask to control the deposition of Gallium (Ga). Crystals grown from the Ga deposits will form the active areas for the GaAs transistors.

In some embodiments, a capping layer of inert material may be deposited on top of the deposits of the first element. The capping layer may have one or more openings exposing the underlying deposits of the first element. The first element may be melted, saturated with at least a second element of the multi-element crystal, and be then allowed to crystallize directly into a multi-element semiconductor according to the III-V Liquid Crystallization process. As used herein, liquid crystallization (e.g., III-V Liquid Crystallization) can involve a process for growing a multi-element crystal over a crystalline substrate, where the growth of the multi-element crystal is seeded off the substrate, producing a crystal that is epitaxial to the substrate. The process includes providing correct seeds, reaction temperatures, and flow rates of limiting reactants to encourage the precipitation of crystals from a liquid solution. The resulting crystals produced from the liquid crystallization process may be further processed to add additional device layers.

Embodiments herein provide for a semiconductor structure having a plurality of semiconductor materials that are epitaxial to each other. A semiconductor crystal may be grown over a non-lattice matched semiconductor substrate using III-V Liquid Crystallization. Liquid crystallization uses the substrate to seed the growth of the semiconductor crystal. The semiconductor crystal so grown will adopt the crystallographic orientation of the substrate, making the final crystal epitaxial to the substrate.

Turning now to the figures, FIG. 1 depicts a flow diagram for the liquid crystallization process used to grow a single crystal multi-element semiconductor over a crystalline substrate. FIGS. 2-8 depict views of the steps of one possible sequence for making a semiconductor structure, consistent with an embodiment of this disclosure.

Turning to FIG. 1, consistent with various embodiments, the process may begin with a wafer (or a substrate created from the wafer) that is substantially crystalline. The substrate may be predominantly made from a group IV element, such as silicon. The substrate may be prepared for the deposition of additional device layers by being, for example, planarized, or doped. An insulator layer can be formed over the top surface of the substrate, as depicted in block 105. The insulator layer may be a thermal oxide, such as silicon-dioxide, deposited according to a wet or dry oxidation process, and having a thickness between 5 nm and 500 nm. An amorphous material may be used for the insulator layer to reduce the probability that nucleation occurring at undesired sites on the insulator (as discussed herein).

Consistent with various embodiments, one or more intermediate layers may be deposited on top of the insulator layer, as shown in block 110. The intermediate layer may include a masking layer that includes a photoresist material that forms a liftoff mask. The intermediate layer may also include additional layers such as a chemical mechanical planarization etch stop layer.

Consistent with various embodiments, openings may be formed in the intermediate layer, as shown in block 115. The openings may be patterned and etched to expose regions of the insulator layer. The openings may be square (other shapes are allowed) with side dimension between 50 nm and 5 um. For various embodiments where the intermediate layer includes a masking layer and additional layers, the additional layers may be patterned and etched with substantially the same features as the masking layer, thus exposing substantially the same areas of the insulator layer as the masking layer. In one embodiment, for example, the intermediate may layer include a CMP etch stop layer. The etch stop layer may be patterned and etched with substantially the same features as the masking layer.

Consistent with embodiments of this disclosure, one or more openings may be formed in the exposed regions of the insulator layer to expose areas of the top surface of the crystalline substrate. The exposed areas may serve as nucleation sites, allowing crystal growth to be seeded off the substrate. In particular embodiments, the dimensions of the openings can be chosen to reduce to probability of having more than one nucleation site within a single opening. Additionally, the size of the openings in the insulator layer may be chosen with consideration to the size of the exposed regions of the insulator to reduce the likelihood of nucleation sites developing on the exposed areas of the insulator. Accordingly, various embodiments are directed toward promoting a single nucleation site in a region in order to promote single crystal growth. This can be particularly useful for discouraging multiple nucleation sites, which may promote the growth of twin crystals that can cause defects. In certain embodiments, the openings in the insulator may be square shape (other shapes are also possible), having a side dimension greater than or equal to 5 nm, but less than 100 nm, while the exposed areas of the insulator may be a square with side dimension between 50 nm and 5 um.

Consistent with various embodiments, a first element of a multi-element crystal may be deposited onto the exposed regions of the insulator layer, into the openings of the insulator layer, and onto the exposed areas of the substrate, as shown by block 120. Prior to the deposition of the first element, the exposed areas of the substrate can be cleaned to remove any native oxide that may be present. The first element may be one or more group III metal such as aluminum (Al), gallium (Ga) or indium (In). In some embodiments, the first element may be deposited over the entire surface of the structure (including the intermediate layer, the exposed regions of the insulator, the openings in the insulator layer, and the exposed areas of the substrate) by evaporation (other depositions methods may be used). Excess amounts of the first element may be removed from the structure by removing one or more intermediate layer (e.g., by removing the liftoff mask), leaving deposits of the first element in the locations of, and shaped by, the features of the layer(s) removed.

Consistent with various embodiments, the method may include forming a capping layer that extends over deposits of the first element, in accordance with block 125. According to some embodiments, the capping layer may extend over the entire structure, including over areas of the first element, and the intermediate layer. The capping layer, intermediate layer, areas of the insulator layer, and areas of the substrate exposed by openings in the insulator layer, may form a cavity, housing the first element. The capping layer may consist of an inert material such as spun on glass or sputtered oxide. In certain embodiments, the material of the capping layer material can be configured to allow precursors or gaseous forms of at least a second element of the multi-element crystal to diffuse through it, and into the cavity housing the first element. In particular embodiments, one or more openings may be formed in the capping layer to allow the second element to be directly deposited to the regions of the first element.

Consistent with various embodiments, the method may also include forming a melt by melting the first element of the multi-element crystal, as indicated by block 130. The first element may be melted by raising the temperature to the liquid crystallization temperature (between 300 and 1200 deg. C). The cavity formed by the capping layer may retain and planarize the melt. The temperature and pressure can then be allowed to stabilize while preserving the liquid state of the melt.

Consistent with the embodiments of this disclosure, a liquid solution may be formed, as shown by block 135. The liquid solution may be formed by introducing a second element of the multi-element crystal to the melt. The second element may include one or more group V element, such as nitrogen (N), phosphorus (P) or arsenide (As). In some embodiments, the liquid solution may include at least a third group III or group V element. In some embodiments, a metal-organic vapor phase epitaxy (MOVPE) reactor can be used to introduce the second element to the melt. Where a metal-organic vapor phase epitaxy (MOVPE) reactor is used, pressure can first be allowed to stabilize between 10 and 300 Torr. A source material (e.g. a carrier gas) containing the second element can then be introduced to the structure. The second element may diffuse through the capping layer, or traverse openings in the capping layer to dissolve into the melt. For example, phosphorus (P) may be introduced to an indium (In) melt (e.g., a volume of liquid indium) using a MOVPE reactor where the phosphorus is supplied by phosphine ($PH_3$) in a hydrogen ($H_2$) carrier gas at a flow rate may be 10-1200 SCCM. The phosphorus will diffuse through the capping layer, or traverse openings in the capping layer, and dissolve into the indium melt, forming the liquid solution.

Consistent with the embodiments of this disclosure, a single crystal multi-element semiconductor can be created, as shown by block 140. Liquid crystallization takes place between 1 minute and 1 hour after the introducing the second element to the melt and forming a saturated liquid solution. During that period, crystallization will begin at nucleation sites seeded off the crystalline substrate at the interface between the liquid solution and the substrate. Epitaxial growth will continue up from the nucleation sites, through the openings in the insulator layer, spread up and over the exposed areas of the insulator layer until the liquid solution is consumed. In some embodiments, the multi-element crystal may grow upward through openings in the capping layer, relieving stress. The structure can then be allowed to cool to a temperature below the reaction temperature of the group III-V material (typically 250-500 C) while maintaining the second element's source material pressure. The second element's source material can then be removed, and the structure can be allowed to cool to an ambient temperature. A single crystal multi-element semiconductor that is substantially epitaxial to the crystalline substrate will be formed from the liquid solution as it cools.

Where indium and phosphorous are used as the first and second elements, respectively of multi-element crystal, the process may yield a single crystal semiconductor composed predominantly of indium phosphide (InP). Similarly, other group III-V multi-element crystals (e.g., GaAs, InGaAs, and InGaAsP), that are epitaxial a seed substrate, may be grown according to the liquid crystallization process discussed herein.

Consistent with various embodiments, the structure, now having a single crystal multi-element semiconductor, may be processed to add additional device layers, as shown in block 145. The processing can include removing the capping layer and planarizing the multi-element crystal using a CMP process. A buffer layer may then be deposited over the multi-element crystal. Openings can be created in the buffer layer to expose the underlying multi-element crystal. A patterned device layer may be deposited over the buffer layer. Additional buffers and devices may be added to create more complex devices. In some embodiments, the structure may be etched to remove undesired excess material. This may include removing the remaining intermediate layer and portions of the insulator layer not separating the multi-element crystal from the crystalline substrate. In some embodiments, the areas of the multi-element semiconductor extending out of, and directly above, the openings in the insulator layer may be removed to eliminate any direct contact between the multi-element crystal and the substrate.

The remaining drawings, FIGS. 2-8, depict embodiments of the semiconductor structure at various stages during the execution of a manufacturing process, which can be consistent with the method described in association with FIG. 1. The figures do not show views of the structure at the processing steps described in blocks 105, 110, and 115 of FIG. 1. These steps include depositing an insulator layer on a crystalline substrate, developing openings in the insulator layer, and depositing patterned intermediate layers consisting of a CMP etch stop layer and a masking layer, and cleaning exposed areas of the substrate of any native oxides.

Figure 2A:
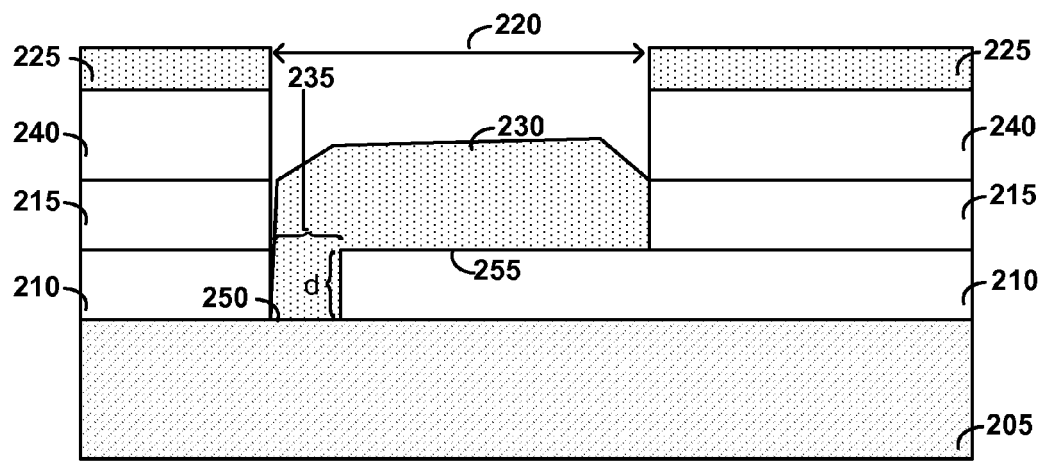
FIG. 2a depicts a cross-sectional view a semiconductor structure after depositing a first element of a multi-element semiconductor, according to various embodiments.
Figure 2B:
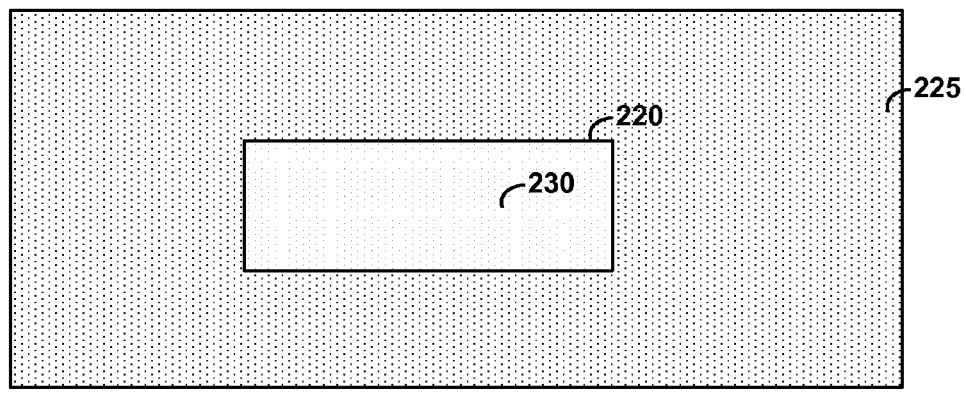
FIG. 2b depicts a top-down view of a semiconductor structure after depositing a first element of a multi-element semiconductor deposit, according to various embodiments.

FIGS. 2a and 2b depict cross-sectional and top-down views, respectively, of the semiconductor structure after creating deposits 225 and 230 of the first element of the multi-element crystal. In certain embodiments, the deposits 225 and 230 of the first element can include one or more elements from group III of the periodic table. References 225 and 230 denote deposits from a single deposition of the first element of the multi-element crystal. The deposit 230 of the first element, located in the patterned region 220, defined by patterned features in the masking layer 240, can serve as the limiting reactant during liquid crystallization. Consistent with embodiments, the patterned region 220 may be a square (other shapes are also possible) with side dimension between 50 nm and 5 um. The deposit 225 is excess material of the first element, and can be removed in accordance with the process step discussed in block 120 of FIG. 1. The opening 235 in the insulator layer 210 extends from the top surface 255 of the insulator down a distance (d) to the top surface 250 of the substrate 205. As discussed herein, the size and shape of the opening can be selected to promote a single nucleation site (e.g., the opening 235 may be a square, though other shapes a possible, with side dimension between 5 nm and 100 nm). The distance d depends on the thickness of the insulator layer, and can be between 5 nm and 500 nm. In some embodiments, a CMP etch stop layer 215 may be patterned with substantially the same features of the masking layer 240. The CMP etch stop layer 215 and masking layer 240 form the intermediate layers of the structure. The CMP etch stop layer 215 may be used to stop the etching process during subsequent CMP steps.

Figure 3A:
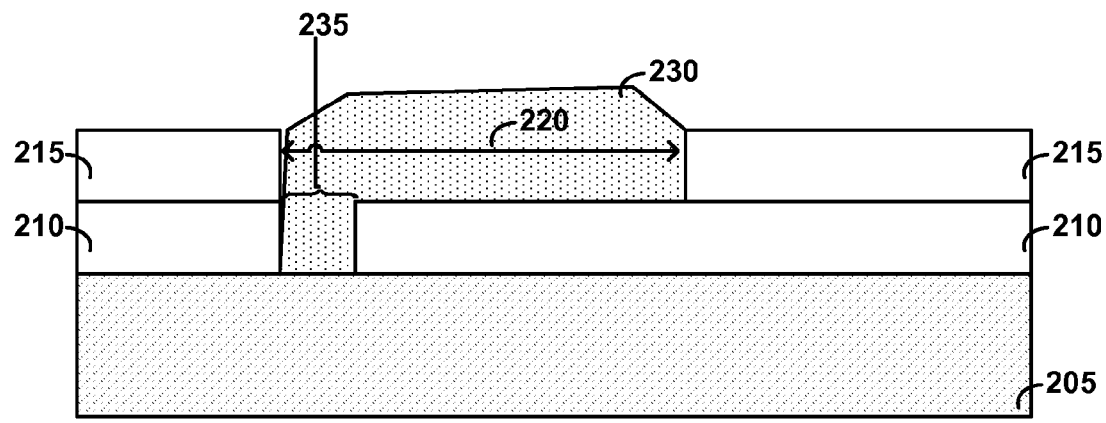
FIG. 3a depicts a cross-sectional view of a semiconductor structure after removal of a masking layer according to various embodiments.
Figure 3B:
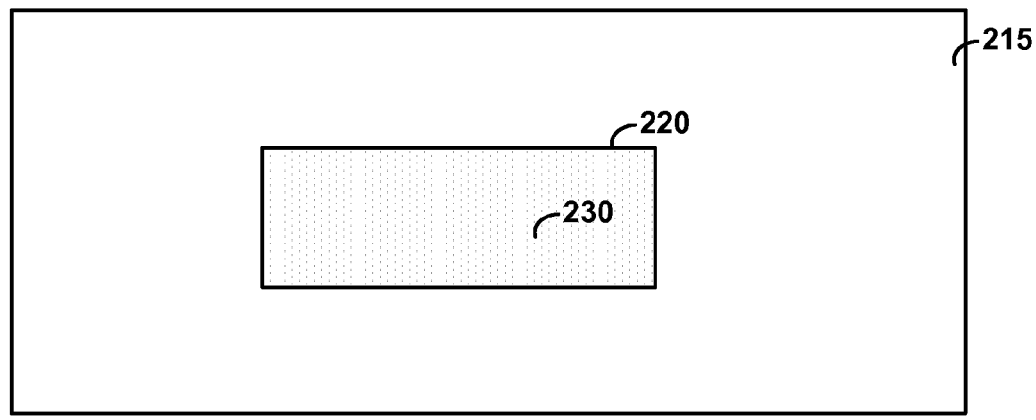
FIG. 3b depicts a top-down view of a semiconductor structure after removal of a masking layer, according to various embodiments.

FIGS. 3a and 3b depict cross-sectional and a top-down views, respectively, of embodiments of the semiconductor structure after the masking layer is removed. In some embodiments, the masking layer may be a layer of photoresist which may be dissolved to cause excess deposit 225 to lift off the structure, leaving deposit 230. Features patterned and etched into the masking layer define the location and shape for the desired deposits of the first element 230. Removing the masking layer eliminates excess deposits of the first element, leaving only the desired deposit 230. The remaining deposit 230 of the first element can be used in the liquid crystallization process. References 205, 210, 215, 220 are the same as discussed in FIGS. 2a and 2b.

Figure 4A:
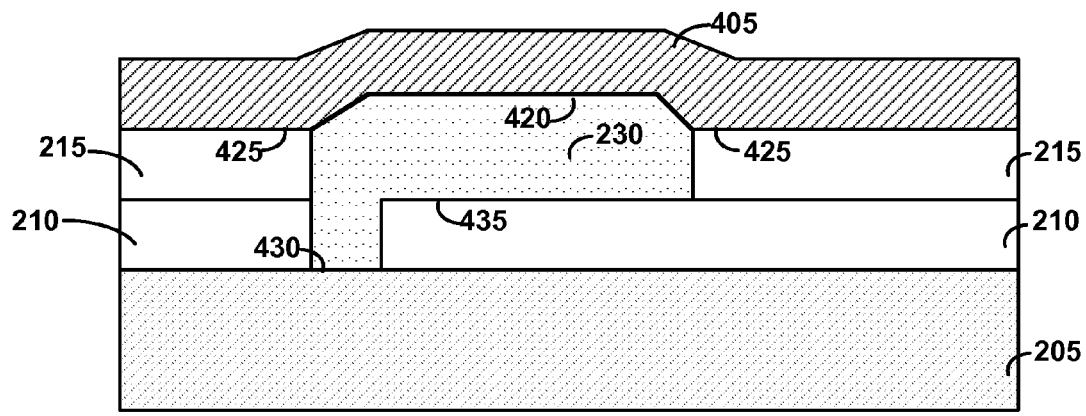
FIG. 4a depicts a cross-sectional view of a semiconductor structure after adding a capping layer of inert material, according to various embodiments.
Figure 4B:
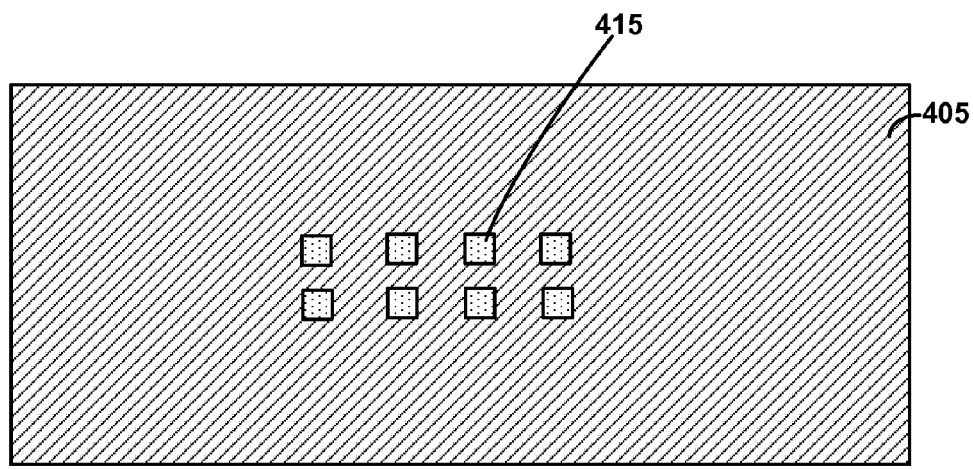
FIG. 4b depicts a top-down view of a semiconductor structure after adding a capping layer of inert material, according to various embodiments.

FIGS. 4a and 4b depict cross-sectional and a top-down views, respectively, of embodiments of the semiconductor structure after depositing the capping layer 405. The capping layer 405 can extend over the entire top surface 420 of the deposit 230 of the first element, forming a cavity with the etch stop layer 215, insulator layer 210, and the top surface of the substrate 430. In some embodiments, the capping layer 405 may also extend over adjacent areas of the top surface 425 of the etch stop layer 215. The capping layer 405 and the cavity, may confine and planarize the deposit 230 of the first element when the first element is melted as discussed in block 130 of FIG. 1. Consequently, the capping layer 405 can be composed of material having a higher melting point higher than the liquid crystallization temperature (between 300 C and 1200 C). This will allow the capping layer 405 to substantially retain its shape when the deposit 230 of the first element are melted. In some embodiments, spin on glass or sputtered oxide may be used for the capping layer 405 because of its high melting point.

In some embodiments, the capping layer 405 may have one or more openings 415 that expose the top surface 420 of the deposit 230 of the first element. During liquid crystallization process, the volume of the multi-element crystal may be grow to approximately twice the volume of the deposit 230 of the first element and, consequently, the cavity. As the crystal's volume expand beyond the volume of the cavity, the walls of the cavity will exert pressure against the crystal. The exerted pressure may cause strain related defects, such as fractures or dislocations in the multi-element crystal. The openings 415 in the capping layer 405 may reduce the strain caused by the multi-element crystal's growth. As the crystal grows up, towards the capping layer 405, the material involved in the crystallization process can be forced up through openings 415 in the capping layer, leaving less material in the cavity. Consequently, crystal growth can continue upward through the openings 415 in the capping layer 405, thus redistributing some of the crystal's volume out of the cavity.

Figure 5:
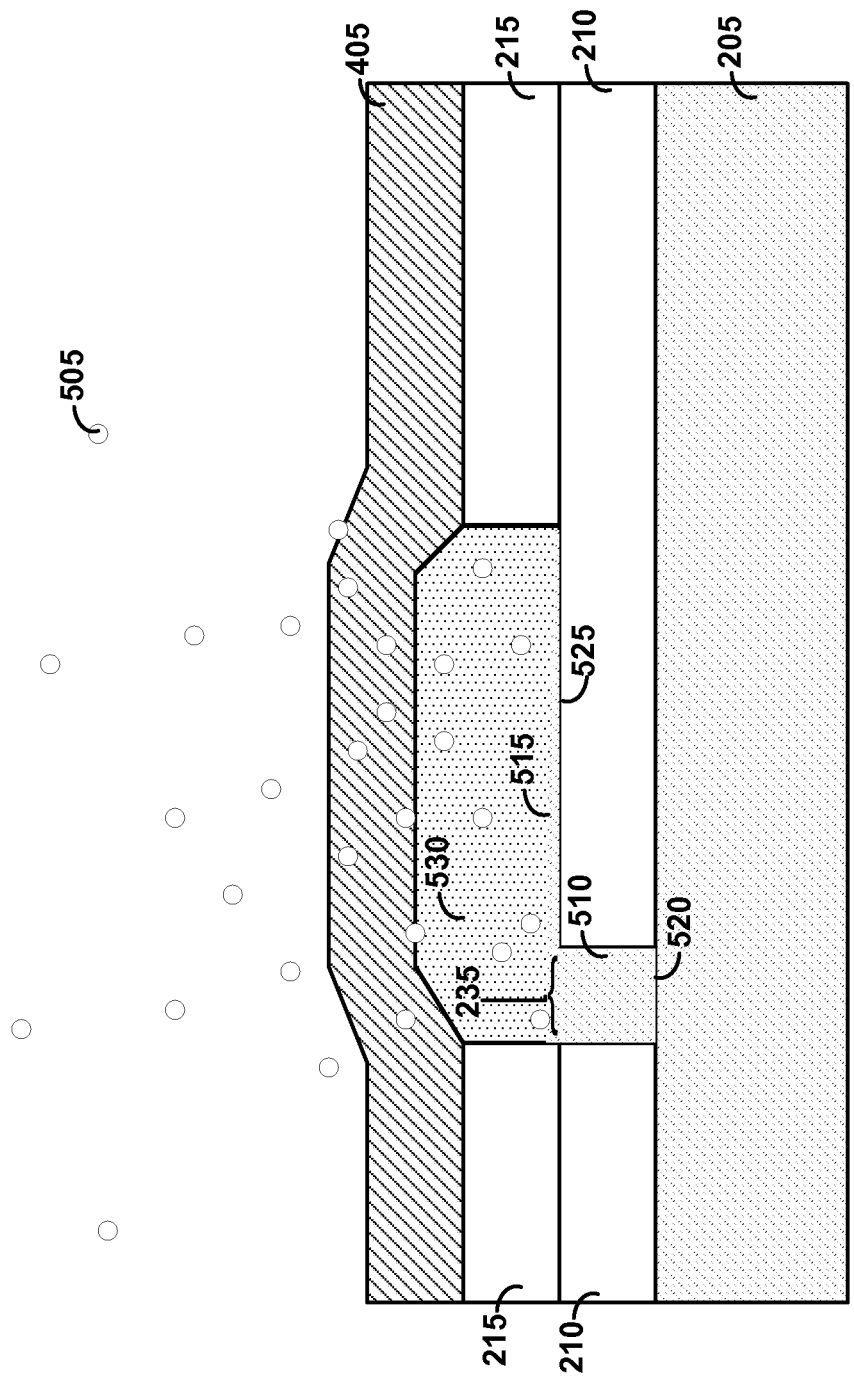
FIG. 5 depicts a cross-sectional view of the semiconductor structure while a multi-element crystal is growing, according to various embodiments.

FIG. 5 depicts a cross-sectional view of the semiconductor structure during liquid crystallization. This figure corresponds with the discussion of block 140 in FIG. 1. In some embodiments, material comprising the second element 505 of the multi-element crystal may diffuse through the capping layer 405 and into the melt of the first element, forming a liquid solution 530. In particular embodiments, the second element 505 may come in dissolve into the melt by traversing the openings (not shown in this figure) in the capping layer 405.

FIG. 5 shows the multi-element crystal growing upward, from the top surface 520 of the substrate, and through the opening 235 in the insulator layer. Once the crystal reaches the top surface 525 of insulator layer 210, growth will continue vertically and laterally across the insulator layer 210. Crystal growth will begin at nucleation sites at the interface between the liquid solution 530 and the top surface of the substrate 520. The amorphous structure of insulator layer 210, and high surface energies of the insulator layer may inhibit nucleation on the insulator's top surface 525. Consequently, the crystalline substrate 205 may seed nucleation of the multi-element crystal 510, increasing the likelihood of the crystal 510 having substantially the same crystallographic orientation as the substrate 205. Crystallization may continue while conditions for liquid crystallization persist, and until the liquid solution 530 is consumed. The resulting product at the end of the liquid crystallization process will be a single crystal multi-element semiconductor.

Figure 6A:
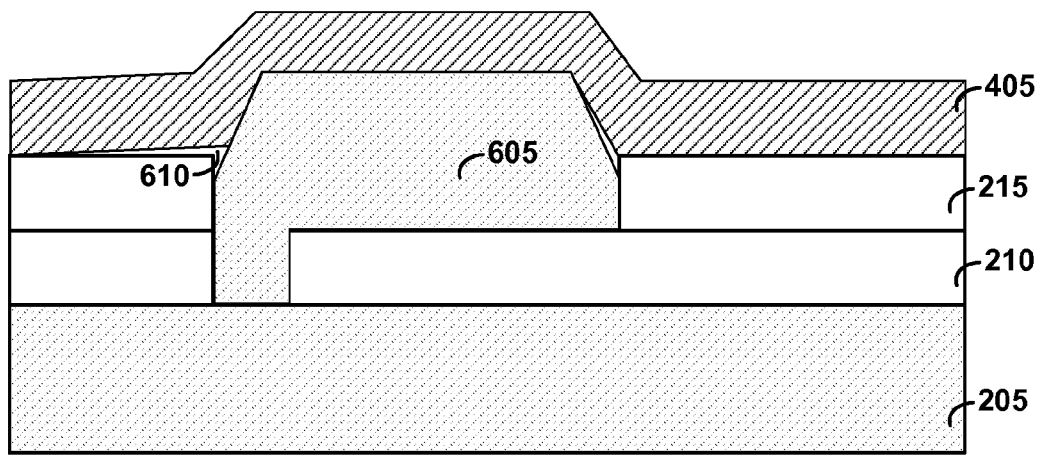
FIG. 6a depicts a cross-section view of a semiconductor structure after a multi-element crystal is fully formed, according to various embodiments.
Figure 6B:
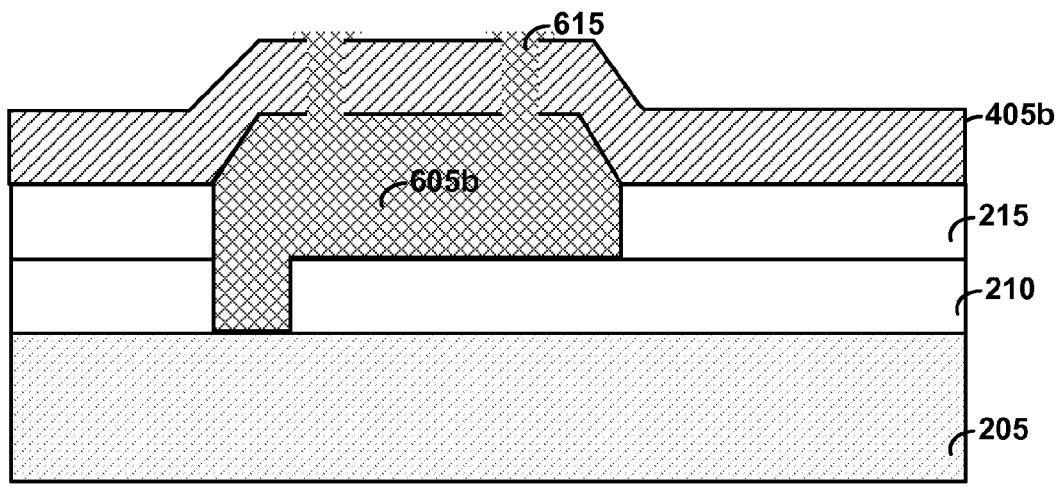
FIG. 6b depicts a cross-sectional view of a semiconductor structure, having openings in a capping layer, after a multi-element crystal is fully formed, according to various embodiments.

FIGS. 6a and 6b depict cross-sectional views of the semiconductor structure after liquid crystallization. The completed multi-element crystal 605 has the same crystallographic orientation as the crystalline substrate 205. In some embodiments, the multi-element crystal 605 may expand to approximately twice the volume of the cavity formed with the capping layer 405. As mentioned in the discussion of FIG. 4, the increased volume demanded by the crystal may cause defects in the crystal 605b, and encourage the capping layer 505 to lift off the etch stop layer 215, at location 610. FIG. 6b illustrates embodiments where openings in the capping layer 405 allowed some crystal material 615 to grow through the capping material. The resulting redistribution of the crystal's volume reduces the strain on the crystal 605 and lessens the likelihood of the capping layer 405b lifting off.

Figure 7:
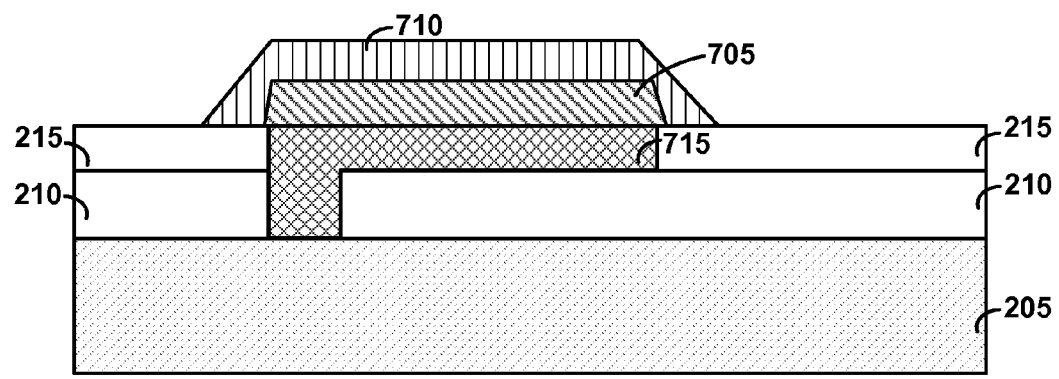
FIG. 7 depicts a semiconductor structure after chemical mechanical planarization, according to various embodiments.

FIG. 7 depicts the semiconductor structure with additional device layers grown on top of the single crystal multi-element semiconductor 715, consistent with various embodiments of the present disclosure. This figure corresponds with discussions of block 145 of FIG. 1. In this figure, the capping layer was removed from the structure in FIG. 6a and FIG. 6b, and the multi-element crystal 715 has been planarized through CMP. A first additional layer 705 may be an insulator or barrier layer. A second additional layer 710 may be a device layer having conductive elements. One or more VIAs in barrier the layer 705 may electrically connect conductive elements from the device layer 710 to the multi-element crystal 715.

Figure 8A:
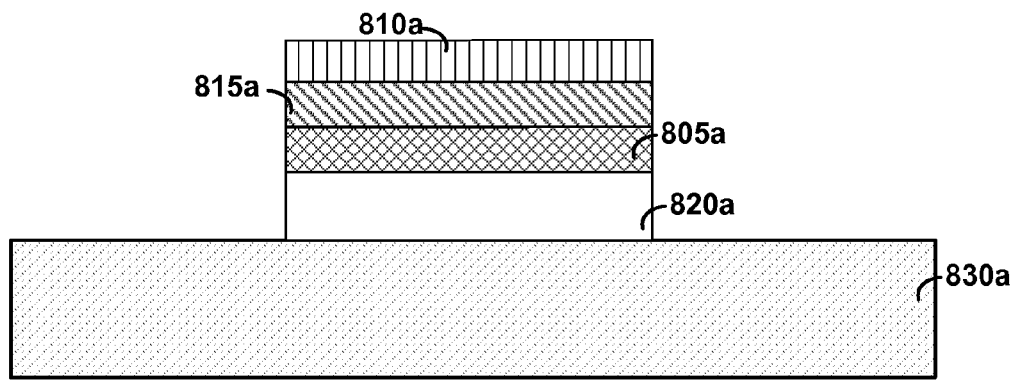
FIG. 8a depicts a semiconductor structure with additional devices layers added and contact with the substrate removed, according to various embodiments.
Figure 8B:
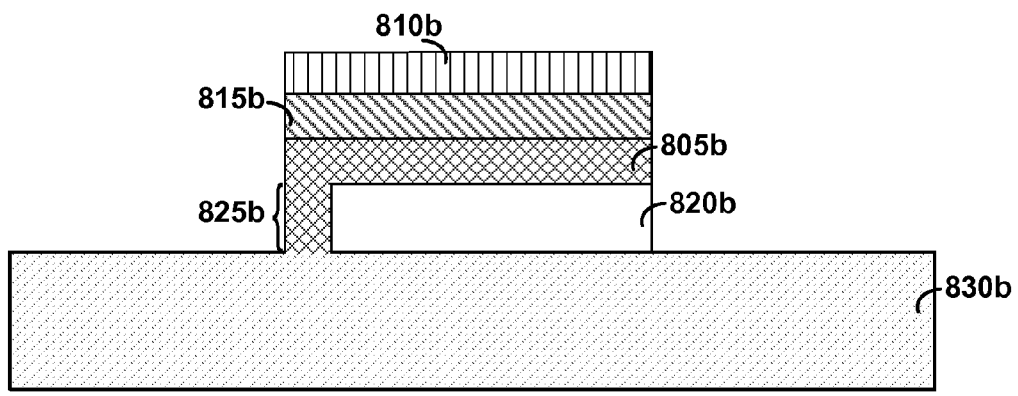
FIG. 8b depicts a semiconductor structure, having contact between the multi-element crystal and the substrate, with additional devices layers added, according to various embodiments.

FIGS. 8a and 8b show cross-sectional views of semiconductor structures, consistent the embodiments of the present disclosure. These figures corresponds to a device that includes additional III-V layers, consistent with the discussions of block 145 in FIG. 1. These figures show the structure in FIG. 7 etched to remove undesired excess material. This may include the intermediate layer, and regions of the insulator layer not separating the multi-element crystal from the substrate. The structures include semiconductor substrates 830a and 830b, insulator layers 820a and 820b, single crystal multi-element semiconductors 805a and 80b, insulator buffer layers 815a and 815b, and a device layers 810a and 810b. The multi-element semiconductors 805a and 805b are epitaxial to the crystalline substrates 830 and 830b. FIG. 8a shows an embodiment where the portion of multi-element semiconductor extending up from the substrate and directly above the opening in the insulator was removed to eliminate any direct contact between the multi-element semiconductor and the crystalline substrate. FIG. 8b shows an embodiment with the contact 825b between the substrate 830b and the multi-element crystal 805b is preserved.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for creating semiconductor structure, having a single crystal multi-element semiconductor with a first lattice constant, on a crystalline semiconductor substrate having a second lattice constant different from the multi-element semiconductor, the method comprising:
    forming an insulator layer over a first top surface of the semiconductor substrate;
    forming an intermediate layer over a second top surface of the insulator layer;
    forming an opening in the intermediate layer to create an exposed region of the second top surface of the insulator layer;
    forming an opening in the exposed region to create an exposed area of the first top surface of the semiconductor substrate;
    depositing a first element of the multi-element semiconductor onto the exposed region, into the opening in the exposed region, and onto the exposed area;
    forming a capping layer that extends over the first element of the multi-element semiconductor;
    melting the first element of the multi-element semiconductor forming a melt, the melt encapsulated between the capping layer, the exposed region, and the exposed area;
    diffusing a quantity of a second element of the multi-element semiconductor through the capping layer and into an enclosed region formed by the capping layer, the intermediate layer, the exposed region, and the exposed area;
    creating a liquid solution by dissolving the quantity of the second element diffused into the enclosed region into the melt; and
    growing a single crystal multi-element semiconductor, seeded off the semiconductor substrate, from the liquid solution.

2. The method of claim 1, wherein:
    the exposed region has side dimensions between 50 nanometers (nm) and 5 micrometers (um), and
    the exposed area has side dimensions between 5 nm and 100 nm.

3. The method of claim 2, wherein the semiconductor substrate is predominantly a Group IV signal crystal material and the insulator layer is silicon-dioxide.

4. The method of claim 2, wherein growing the single crystal multi-element semiconductor occurs through a III-V Liquid Crystallization process.

5. The method of claim 1, wherein creating the liquid solution comprises supplying a precursor gas that includes at least the second element of the multi-element semiconductor.

6. The method of claim 5, wherein creating the liquid solution includes diffusing elements of the second element the multi-element semiconductor through the capping layer and into a melt of the first element of the multi-element semiconductor.

7. The method of claim 2, wherein forming the capping layer includes forming openings in the capping layer to expose areas of the first element of the multi-element semiconductor.

8. The method of claim 7, wherein creating the liquid solution includes diffusing material having the at least the second element of the multi-element semiconductor through the openings in the capping layer to interact with a melt of the first element of the multi-element semiconductor.

9. The method of claim 7, wherein forming the single crystal multi-element semiconductor further includes causing a portion of the single crystal multi-element semiconductor to form in openings in the capping layer.

10. The method of claim 1, wherein the single crystal multi-element semiconductor spans a third top surface of the exposed region.

11. The method of claim 2, wherein the liquid solution further comprises a third element selected from the group consisting of Group III and Group V.

12. The method of claim 1 wherein the multi-element semiconductor is selected from the group consisting of GaAs, GaN, GaP, InP, InAs, AlN, InSb, AlAs, InGaAs, InAlAs, and InGaAsP.

13. A semiconductor structure, comprising:
a substrate that is a crystalline semiconductor having a first top surface and a first lattice constant;
an insulator layer extending over the top surface of the substrate, the insulator layer including a first opening creating an exposed area of the first top surface of the substrate, the exposed area having side dimensions between 5 nm and 100 nm;
an intermediate layer having a second opening that creates an exposed region of a second top surface of the insulator layer including the first opening, wherein the exposed region is larger than the exposed area of the first top surface of the substrate;
a single crystal multi-element semiconductor having a second lattice constant different from the first lattice constant, seeded from the substrate, and spanning the exposed region and the first opening; and
a capping layer extending over the single crystal multi-element semiconductor and over adjacent areas of the intermediate layer, and creating an enclosed region containing the single crystal multi-element semiconductor, the enclosed region including the capping layer, the intermediate layer, the exposed region, and the exposed area.

14. The semiconductor structure in claim 13, wherein the exposed region has side dimensions between 50 nm and 5 um.

15. The semiconductor structure in claim 13, wherein the substrate is predominantly a Group IV single crystal material, and the single crystal multi-element semiconductor comprises elements from Group III and Group V.

16. The semiconductor structure in claim 15, wherein the substrate is silicon, and the insulator layer is silicon-dioxide.

17. The semiconductor structure in claim 15, wherein the capping layer has at least one opening exposing the single crystal multi-element semiconductor.

18. The method of claim 1, further comprising:
removing a volume of the single crystal multi-element semiconductor extending from the exposed area of the first top surface of the semiconductor substrate up through the opening in the exposed region, the removed volume separating the single crystal multi-element semiconductor from the semiconductor substrate.

19. The method of claim 2, wherein:
the side dimensions of the exposed region is determined based on the side dimensions of the exposed areas to prevent formation of nucleation sites on the exposed region.

* * * * *